United States Patent
Chen et al.

(10) Patent No.: US 7,558,718 B2
(45) Date of Patent: Jul. 7, 2009

(54) METHOD AND SYSTEM FOR DESIGN VERIFICATION OF VIDEO PROCESSING SYSTEMS WITH UNBALANCED DATA FLOW

(75) Inventors: Jiann-Tsuen Chen, Saratoga, CA (US); Jean-Huang Chen, Cupertino, CA (US)

(73) Assignee: Broadcom Corporation, Irvine, CA (US)

( * ) Notice: Subject to any disclaimer, the term of this patent is extended or adjusted under 35 U.S.C. 154(b) by 362 days.

(21) Appl. No.: 11/005,647

(22) Filed: Dec. 6, 2004

(65) Prior Publication Data

US 2006/0095878 A1 May 4, 2006

Related U.S. Application Data

(60) Provisional application No. 60/622,675, filed on Sep. 28, 2004.

(51) Int. Cl.
*G06F 17/50* (2006.01)
(52) U.S. Cl. .................. 703/13; 716/4; 716/5
(58) Field of Classification Search .......... 703/13
See application file for complete search history.

(56) References Cited

U.S. PATENT DOCUMENTS

| | | | |
|---|---|---|---|
| 5,892,535 A * | 4/1999 | Allen et al. ............ 725/36 |
| 5,995,736 A * | 11/1999 | Aleksic et al. .......... 716/18 |
| 6,263,303 B1 * | 7/2001 | Yu et al. ............... 703/19 |
| 6,327,000 B1 * | 12/2001 | Auld et al. ............. 348/441 |
| 6,385,244 B1 * | 5/2002 | Morad et al. ........ 375/240.16 |
| 2002/0140706 A1 * | 10/2002 | Peterson et al. ......... 345/611 |
| 2004/0006584 A1 * | 1/2004 | Vandeweerd ............ 709/107 |
| 2004/0261052 A1 * | 12/2004 | Perry et al. ............ 716/19 |
| 2005/0280438 A1 * | 12/2005 | Park ..................... 326/41 |

OTHER PUBLICATIONS

Kim et al, "Simulating Multimedia Systems with MVPSIM", IEEE Design and Test of Computers, vol. 12, Issue 4, Winter 1995, pp. 18-27.*
Wilberg et al, "VLIW Processor Codesign for Video Processing", Design Automation for Embedded Systems, vol. 2, pp. 79-119, 1997.*
Dutta et al., "A Design Study of a .25-um Video Signal Procesor, IEEE 1998, pp. 501-519".*

* cited by examiner

*Primary Examiner*—Zoila Cabrera
*Assistant Examiner*—Andre Pierre Louis
(74) *Attorney, Agent, or Firm*—McAndrews, Held & Malloy, Ltd.

(57) ABSTRACT

In a video system, a method and system for design verification of video processing systems with unbalanced data flow are provided. Efficient design verification may be provided for multi-field video processors with separate control data flow and video data flow. A design verification architecture may utilize a reference model to generate test and expected data for a controller and/or a data processor in a multi-field video processor hardware model. The design verification architecture may provide test data via stimulus feeders and may compare simulated and expected data in result checkers. When the controller is selected for verification, the design verification architecture may verify the operation and design of the multi-field video processor control data flow implementation. When the data processor is selected for verification, the design verification architecture may verify the operation and design of the multi-field video processor video data flow implementation.

33 Claims, 7 Drawing Sheets

METHOD AND SYSTEM FOR DESIGN VERIFICATION OF VIDEO PROCESSING SYSTEMS WITH UNBALANCED DATA FLOW

CROSS-REFERENCE TO RELATED APPLICATIONS/INCORPORATION BY REFERENCE

This patent application makes reference to, claims priority to and claims benefit from U.S. Provisional Patent Application Ser. No. 60/622,675 filed Sep. 28, 2004.

This application makes reference to U.S. application Ser. No. 11/005,092 filed Dec. 6, 2004.

The above stated applications are hereby incorporated herein by reference in their entirety.

FIELD OF THE INVENTION

Certain embodiments of the invention relate to the design verification of video processing systems. More specifically, certain embodiments of the invention relate to a method and system for design verification of video processing systems with unbalanced data flow.

BACKGROUND OF THE INVENTION

In video system applications, a video stream may need to be processed when it is received and before it is transmitted, displayed, and/or stored. For example, when a video stream is to be transmitted and/or stored, the video fields and/or frames that comprise the video stream may be compressed to reduce redundant information and increase the amount of video content that may be transmitted in a transmission channel and/or the amount of video content that may be stored in a storage device. A video frame may refer to a picture in the video stream while a video field may refer to one of two separate sub-pictures that may be formed from a video frame. In this case, one or more video encoders may be utilized to compress the video stream in accordance with the specifications and requirements of the transmission channel and/or the storage device. The encoded video fields and/or frames in an encoded video stream may be decompressed to reproduce the original video content in the video stream. In this case, video decoders may be utilized to decompress the encoded video stream.

In another example, when a video stream is to be displayed, the video stream may be modified or adapted to a particular format in order to conform to a particular display device. This may occur in instances when, for example, interlaced video format is to be displayed on a display device that supports progressive or non-interlaced video format. In interlaced video, the display device may support the use of video fields, while in progressive, or non-interlaced, video the display device may support the use video frames. When the video stream comprises video fields and the display device only supports progressive video, a deinterlacer may be utilized to convert the video stream into a stream of video frames that may be displayed by the display device.

The design and implementation of video processing systems, such as encoders, decoders, or deinterlacers in integrated circuits (ICs) may be very complex since many different subsystems are necessary to perform and/or control the operations that compress, decompress, and convert interlaced video into progressive video. As a result, the operation and/or functionality of the many different subsystems that comprise these complex architectures may be very difficult to verify during the design phase. Moreover, the operation and/or functionality of video processors may dynamically change since the contents of a video stream may be changing with time. This difficulty persists whether benchtests generated for verification are developed for video processor hardware models based on a Register Transfer Level (RTL) description or on representations based on hardware description languages (HDLs). For example, hundreds or even thousands of video fields and/or frames may be necessary to verify a portion of the operations in a specific hardware implementation of a video processor. In this regard, finding and isolating design flaws may be very time consuming and may lead to either an incomplete verification of a video processing system or to a prolonged verification period which may adversely affect the time-to-market of a product.

It may be quite common that a video processor design would have separate control data flow and video data flow paths. It may also be quite common that the amount of control data flow and video data flow varies significantly, i.e., the data flow is such that a digital video system is unbalanced. To test and verify these two types of blocks while operating together may usually require very long simulation times. Moreover, it may still be likely, even after a long simulation, that the operation of these types of blocks may be severely under tested. The situation may be even worse when the two types of blocks have data dependency from each other such as a feedback loop control.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention may be found in a method and system for design verification of video processing systems with unbalanced data flow. Aspects of the method may comprise selecting a device in a multi-field video processor hardware model for verification. The multi-field video processor hardware model may be selected from a multi-filed deinterlacer hardware model, a multi-field video encoder hardware model, or a multi-field video decoder hardware model. A test configuration file may be generated based on a video data flow and a control data flow function performed by the selected device. Test input data may be generated based on information associated with the test configuration file. Simulated output data may be generated in the selected device based on the test input data. Simulated output data may be compared with expected output data, wherein the simulated output data is derived from information associated with the test configuration file.

In another aspect of the method, a controller may be selected in the multi-field video processor hardware model for verification of the control data flow function. When the controller is selected, controller test input data and controller expected output data may be generated based on information associated with the test configuration file. Controller simulated output data may be generated based on the controller test input data. The controller simulated output data and the controller expected output data may be compared and design flaws may be determined based on information associated with the comparison.

In another aspect of the method, a data processor may be selected in the multi-field video processor hardware model for verification of the video data flow function. When the data processor is selected, data processor test input data and data processor expected output data may be generated based on information associated with the test configuration file. Data processor simulated output data may be generated based on the data processor test input data. The data processor simulated output data and the data processor expected output data may be compared and design flaws may be determined based on information associated with the comparison.

Another embodiment of the invention may provide a machine-readable storage, having stored thereon, a computer program having at least one code section executable by a machine, thereby causing the machine to perform the steps as described above for handling video processor designs.

Aspects of the system may comprise at least one processor that selects a device in a multi-field video processor hardware model for verification. The processor may select the multi-field video processor hardware model from a multi-filed deinterlacer hardware model, a multi-field video encoder hardware model, or a multi-field video decoder hardware model. The processor may generate a test configuration file based on a video data flow and a control data flow function performed by the selected device. The processor may generate a plurality of test input data based on information associated with the test configuration file. The processor may generate simulated output data in the selected device based on the test input data. The processor may compare simulated output data with expected output data, wherein the simulated output data is derived from information associated with the generated test configuration file.

In another aspect of the system, the processor may select a controller in the multi-field video processor hardware model for verification of the control data flow function. When the controller is selected, the processor may generate controller test input data and controller expected output data based on information associated with the test configuration file. The processor may generate controller simulated output data based on the controller test input data. The processor may compare the controller simulated output data and the controller expected output data and may determine design flaws based on information associated with the comparison.

In another aspect of the system, the processor may select a data processor in the multi-field video processor hardware model for verification of the video data flow function. When the data processor is selected, the processor may generate data processor test input data and data processor expected output data based on information associated with the test configuration file. The processor may generate data processor simulated output data based on the data processor test input data. The processor may compare the data processor simulated output data and the data processor expected output data and may determine design flaws based on information associated with the comparison.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for design verification of video processing systems with unbalanced data flow. Certain aspects of the invention may comprise a design verification architecture that may utilize a reference model to generate test and expected data for a controller and/or a data processor in a multi-field video processor hardware model. When the controller is selected for verification, the design verification architecture may verify the operation and design of the multi-field video processor control data flow implementation. When the data processor is selected for verification, the design verification architecture may verify the operation and design of the multi-field video processor video data flow implementation. This approach may result in a more efficient and thorough verification of multi-field video processing systems, which may lead to faster time-to-market of a product.

Figure 1:
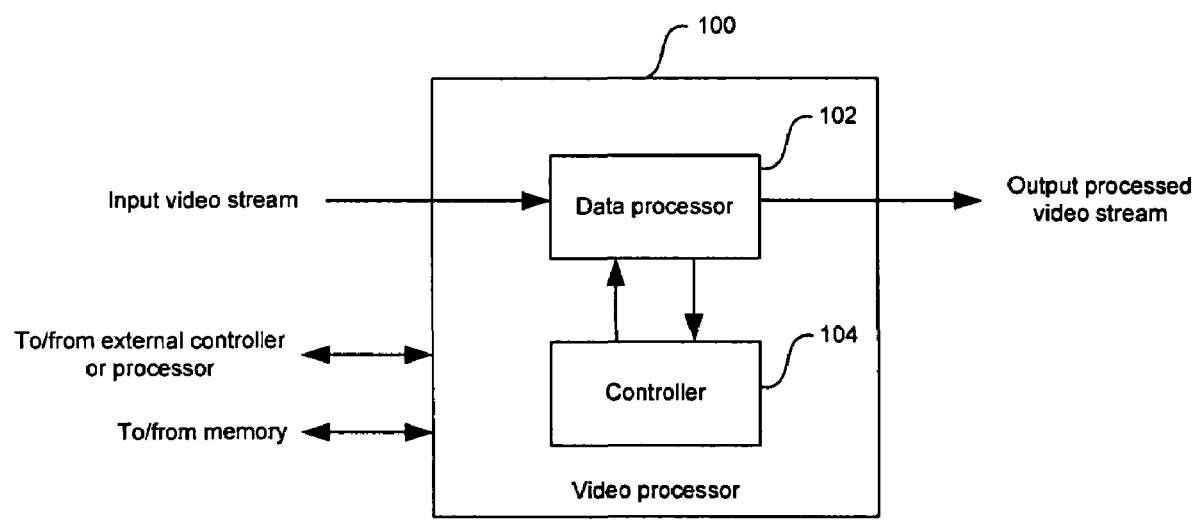
FIG. 1 is a block diagram of exemplary video processing system that utilizes a data processor in a video data flow and a controller, in a control data flow in accordance with an embodiment of the invention.

FIG. 1 is a block diagram of exemplary video processing system that utilizes a data processor in a video data flow and a controller in a control data flow, in accordance with an embodiment of the invention. Regarding FIG. 1, a video processor 100 may comprise suitable logic, circuitry, and/or code that may be adapted to process an input video stream and generate an output processed video stream. The video processor 100 may be a multi-field video processing system, that is, it may utilize information in multiple fields or frames of video and/or information generated from multiple field or frames of video to perform a desired operation on a current field or frame of video. The video processor 100 may communicate with external controller and/or processors during operation. The video processor 100 may also communicate with external memory during operation. The video processor 100 may comprise local memory, in which case the video processor 100 may communicate with the local and/or the external memory during operation. The multiple fields or frames of video which the video processor 100 utilizes may occur before or after the current field or frame in the video stream. In some instances, at least a portion of the operations and/or functionality of the video processor 100 may be implemented in a processor such as a central processing unit (CPU) and/or a digital signal processor (DSP), an application specific integrated circuit (ASIC), and/or a programmable device such as a field programmable gate array (FPGA) or a complex programmable logic device (CPLD).

The video processor 100 may comprise a data processor 102 and a controller 104. The data processor 102 may comprise suitable logic, circuitry, and/or code that may be adapted to perform at least one of a plurality of operations on the video content of the input video stream. For example, the data processor 102 may perform video coding, video decoding, deinterlacing, and/or may perform video content analysis as in machine vision or content management applications. In this regard, the data processor 102 may comprise multiple functional blocks, which may be utilized to provide the desired operation. The data processor 102 may operate in, for example, the video data flow path, which may comprise a path that exists between the input video stream and the output processed video stream.

The controller 104 may comprise suitable logic, circuitry, and/or code that may be adapted to control at least a portion of the operation and/or functionality of the data processor 102. The controller 104 may provide the data processor 102 with control information to perform operations on a cycle-by-cycle basis, where each cycle of operations may refer to operations performed on a current video field or current video frame. The controller 104 may receive information, for example, statistical information, from the data processor 102 that may be utilized by the controller 104 to update and/or modify the control information sent to the data processor 102.

In operation, a video field or video frame from the input video stream may be received by the data processor 102. The controller 104 may provide the data processor 102 with a set of instructions, for example, register settings, that indicate to the data processor 102 operations that may be performed on the received video field or video frame in a cycle. In some instances, the data processor 102 may require information from video fields or video frames that occur before and/or after the current video field or video frame in the video stream. In that case, the data processor 102 may receive the required information from internal buffers or memory and/or from external buffers or memory. In this regard, the controller 104 may have provided the data processor 102 with appropriate instructions that may be utilized to obtain the appropriate information for processing the current video field or frame. After processing the current video field or frame, the data processor 102 may generate, for example, a plurality of statistical data that may be transferred to the controller 104. The controller 104 may utilize the statistical data to update or modify the control instructions it provides the data processor 102 in subsequent cycles of operation.

Figure 2A:
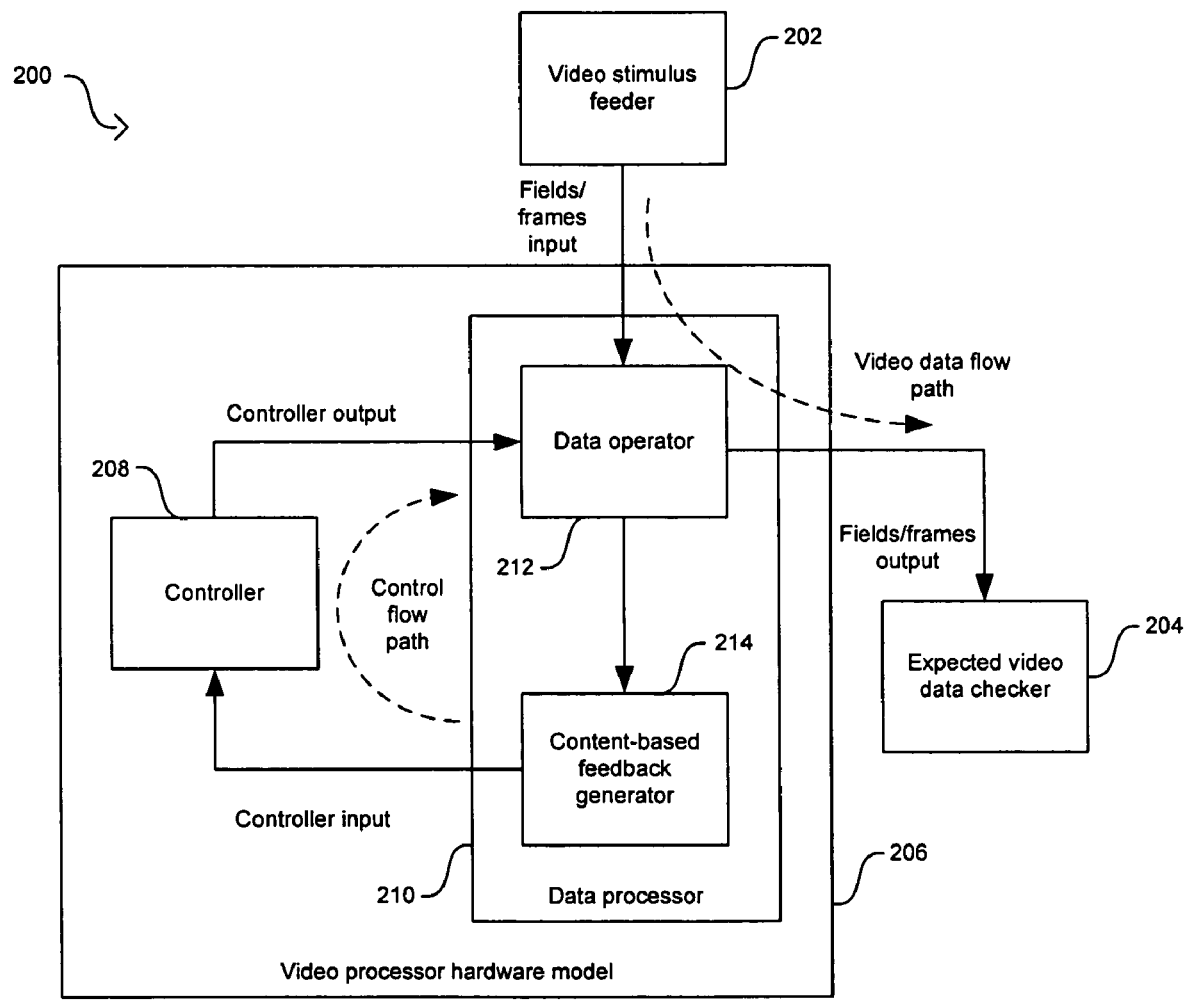
FIG. 2A is a block diagram of exemplary video processor hardware model design verification architecture, in accordance with an embodiment of the invention.

FIG. 2A is a block diagram of exemplary video processor hardware model design verification architecture, in accordance with an embodiment of the invention. Referring to FIG. 2A, a video system design verification architecture 200 may comprise a video stimulus feeder 202, an expected video data checker 204, and a video processor hardware model 206. The video processor hardware model 206 may comprise a controller 208 and a data processor 210. The data processor 210 may comprise a data operator 212 and a content-based feedback generator 214. The video stimulus feeder 202 may comprise suitable logic, circuitry, and/or code that may be adapted to transfer a plurality of test input data to the video processor hardware model 206.

The video stimulus feeder 202 may transfer test input data to the video processor hardware model 206 in accordance with the cycle-by-cycle operation of the video processor hardware model 206. In this regard, the test input data may comprise information on a current video field or video frame and/or information on multiple other video fields or video frames that may be utilized by the video processor hardware model 206 when processing the current video field or video frame. A video processor reference model based on a test configuration file may generate the test input data transferred from the video stimulus feeder 202. The video processor reference model may be a behavioral model, for example, a C model, of the operation and/or functionality of the video processor design to be verified. The test configuration file may provide the video processor reference model with a set of functions and/or conditions in the design and/or operation of the video processor that may require verification.

The expected video data checker 204 may comprise suitable logic, circuitry, and/or code that may be adapted to compare the simulated output data generated by the video processor hardware model 206 with expected output data. The video processor reference model, based on the test configuration file, may generate the expected output data in the expected video data checker 204. When the simulated output data agrees with the corresponding expected output data, then the video processor design correctly performs the functions and/or operations described in the video processor reference model. Otherwise, a flaw may exist in the video processor design.

The video processor hardware model 206 may comprise suitable logic, circuitry, and/or code that may be adapted to simulate and/or emulate a hardware implementation of the functions and/or operations of the video processor. In this regard, simulation and emulation may perform the same function and the distinction may only reside in the representation utilized for the video processor. For example, when the video processor hardware model 206 refers to a register transfer level (RTL) description of the video processor or a representation of the video processor based on hardware description languages (HDLs) such as Verilog or VHDL, then the video processor hardware model 206 may be said to perform a simulation of the video processor. When the video processor hardware model 206 refers to, for example, an FPGA or CPLD implementation of the video processor, then the video processor hardware model 206 may be said to perform an emulation of the video processor. In some instances, a portion of the video processor hardware model 206 may be simulated and a remaining portion of the video processor hardware model 206 may be emulated.

The data operator 212 may comprise suitable logic, circuitry, and/or code that may be adapted to perform a plurality of operations on the video test input data provided by the video stimulus feeder 202 and to generate a plurality of simulated output data to be transferred to the expected video data checker 204. The data operator 212 may process or operate on at least a portion of a video field or video frame in each cycle of operation. The data operator 212 may perform, for example, coding, decoding, interlacing, object identification, and other image processing operations. The video data flow path in the video processor hardware model 206 may be described as flowing through the data operator 212. The data operator 212 may receive a plurality of control signals and/or control information from the controller 208. These control signals may correspond to particular register settings in the data operator 212. The data operator 212 may update or modify at least a portion of the operations being performed on a current video field or video frame based on these control signals. In this regard, the data operator 212 may update or modify its operations every cycle based on the control signals provided by the controller 208. In some instances, for example, there may not be updates to the operations of the data operator 212 in a particular cycle. In other instances, for example, there may be updates to the operations of the data operator 212 in consecutive cycles.

Updating or modifying the operations of the data operator 212 may be based, for example, on the type of the current video field or video frame. For example, in coding and decoding operations, intra-coded fields or frames may be processed differently than inter-coded fields or frames. In another example, in deinterlacing operations, top-field video fields may be processed differently than bottom-field video fields. The data operator 212 may also be adapted to generate a plurality of signals, which may be transferred to the content-based feedback generator 214. The data operator 212 may generate the signals provided to the content-based feedback generator 214 based on the contents and/or on results from operations performed on the contents of the current video field or video frame.

The content-based feedback generator 214 may comprise suitable logic, circuitry, and/or code that may be adapted to generate statistical information and/or indications of certain conditions that may be determined during the processing of video fields or video frames in the data operator 212. For example, when the data operator 212 detects a sequencing error in the order of the video fields or video frames in the video stream, the content-based feedback generator 214 may generate a signal to indicate to the controller 208 that such sequencing error occurred.

The controller 208 may comprise suitable logic, circuitry, and/or code that may be adapted to generate a plurality of control signals that control the operation of the data operator 212. The controller 208 may update or modify register settings in the data operator 212 on a cycle-by-cycle basis. The controller 208 may comprise a plurality of registers where a plurality of modes of operation may be stored. In this regard, when a mode of operation is required during a particular cycle of operation in the data operator 212, the controller 208 may provide the data operator 212 with a set of instructions based on the mode of operation. The control data flow path in the video processor hardware model 206 may be said to flow through the controller 208.

Since the data flow content in the video data flow path may be larger than the data flow content in the control data flow path, the overall data flow in the video processor may be unbalanced. For example, in the case of an NTSC video stream one field may contain, for example, 720×240 pixels. When each pixel is represented by, for example, a 32-bit word, the video data flow rate for a 60 fields-per-second (fps) NTSC video stream is approximately 332 Mbps. On the other hand, it may be possible that over a period of time in which the data operator 212 processes one second of the NTSC input video stream, the controller 208 may transfer one instruction per cycle or video field, that is, 60 instructions per second, to the data operator 212. Each instruction transferred may provide, for example, information as to the type of field that is currently being processed. In instances when each of the instructions transferred is also represented by, for example, a 32-bit word, the control data flow rate for the 60 fps NTSC video stream is 1,920 bps. This example illustrates that during design verification operations, any design flaws that may be present in the control data flow path may take a very long time to identify because a significant portion of the verification process is tied up with the larger content in the video data flow path.

Figure 2B:
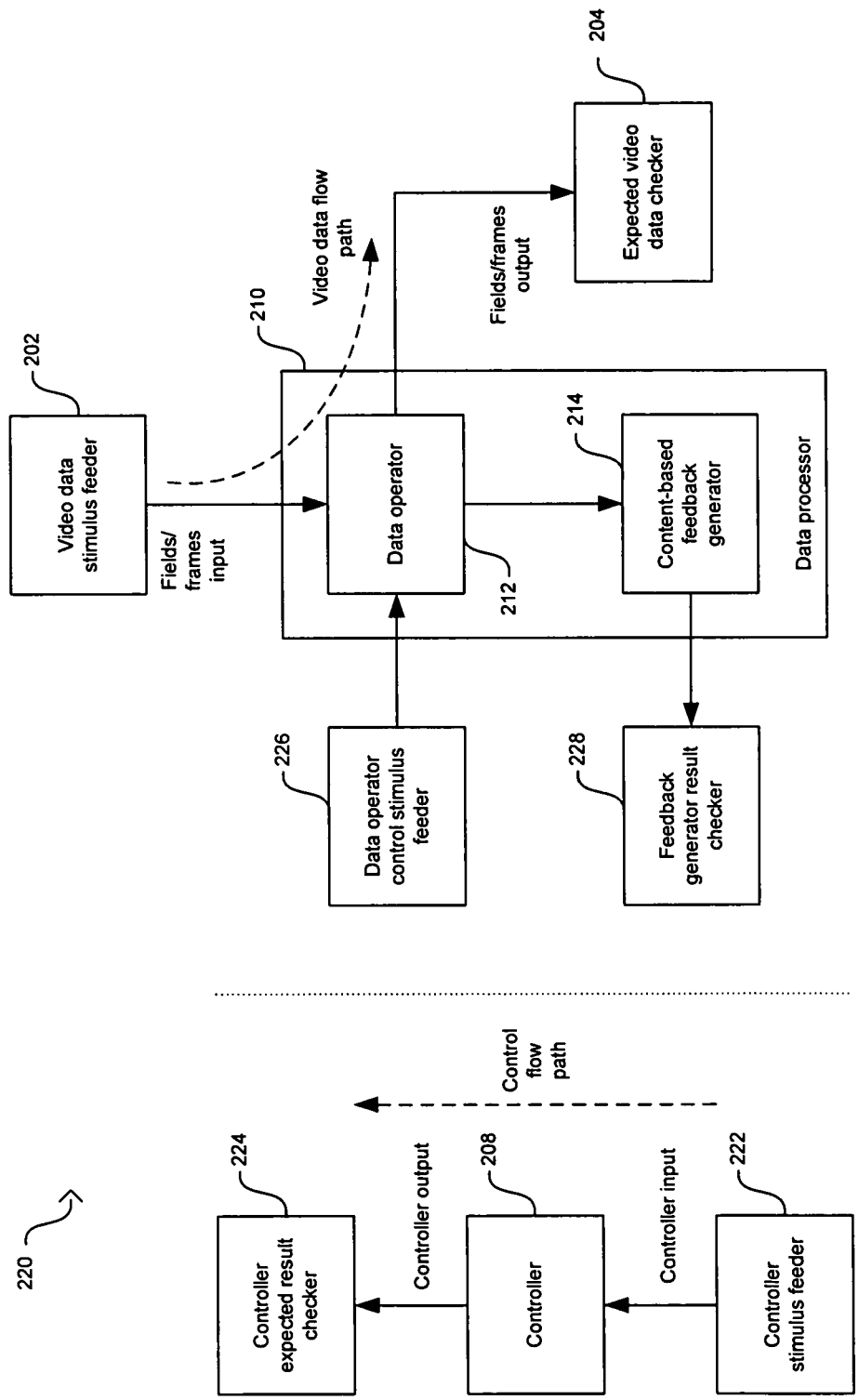
FIG. 2B is a block diagram of exemplary video processor hardware model design verification architecture with separate video data flow and control data flow verification, in accordance with an embodiment of the invention.

FIG. 2B is a block diagram of an exemplary video processor hardware model design verification architecture with separate video data flow and control data flow verification, in accordance with an embodiment of the invention. Referring to FIG. 2B, the system design verification architecture 220 may comprise the video data stimulus feeder 202, the controller 208, the data processor 210, the data operator 212, the content-based feedback generator 214, and the expected video data checker 204 in FIG. 2A. Moreover, the system design verification architecture 220 may comprise a data operator control stimulus feeder 226, a feedback generator result checker 228, a controller stimulus feeder 222, and a controller expected result checker 224. The system design verification architecture 220 may be adapted to separate the video processor verification operations based on the video data flow and the control data flow. In this regard, the verification of the video processor hardware model 206 in FIG. 2A may be separated into a video data flow path verification performed on the data operator 212 and a control data flow path verification performed on the controller 208. The video data flow path verification may also comprise the operation of the content-based feedback generator 214.

The data operator control stimulus feeder 226 may comprise suitable logic, circuitry, and/or code that may be adapted to transfer a plurality of data processor input test data to the data operator 212. The data processor input test data transferred from the data operator control stimulus feeder 226 may correspond to the control signals provided by the controller 208 to the data operator 212. A video processor reference model based on a test configuration file, which may be configured to verify the operation and design of the data processor 210, may generate the data processor input test data. The feedback generator result checker 228 may comprise suitable logic, circuitry, and/or code that may be adapted to verify the data processor simulated output data generated by the content-based feedback generator 214 by comparing it with the data processor expected output data generated by the video processor reference model.

The controller stimulus feeder 222 may comprise suitable logic, circuitry, and/or code that may be adapted to transfer a plurality of controller input test data to the controller 208. The controller input test data transferred form the controller stimulus feeder 222 may correspond to the content-based feedback signals provided by the content-based feedback generator 214 to the controller 208. The video processor reference model based on a test configuration file, which may be configured to verify the operation and design of the controller 208, may generate the controller input test data. The controller expected result checker 224 may comprise suitable logic, circuitry, and/or code that may be adapted to verify the controller simulated output data generated by the controller 208. The verification may be achieved by comparing the simulated output data with the controller expected output data generated by, for example, the video processor reference model.

Figure 3A:
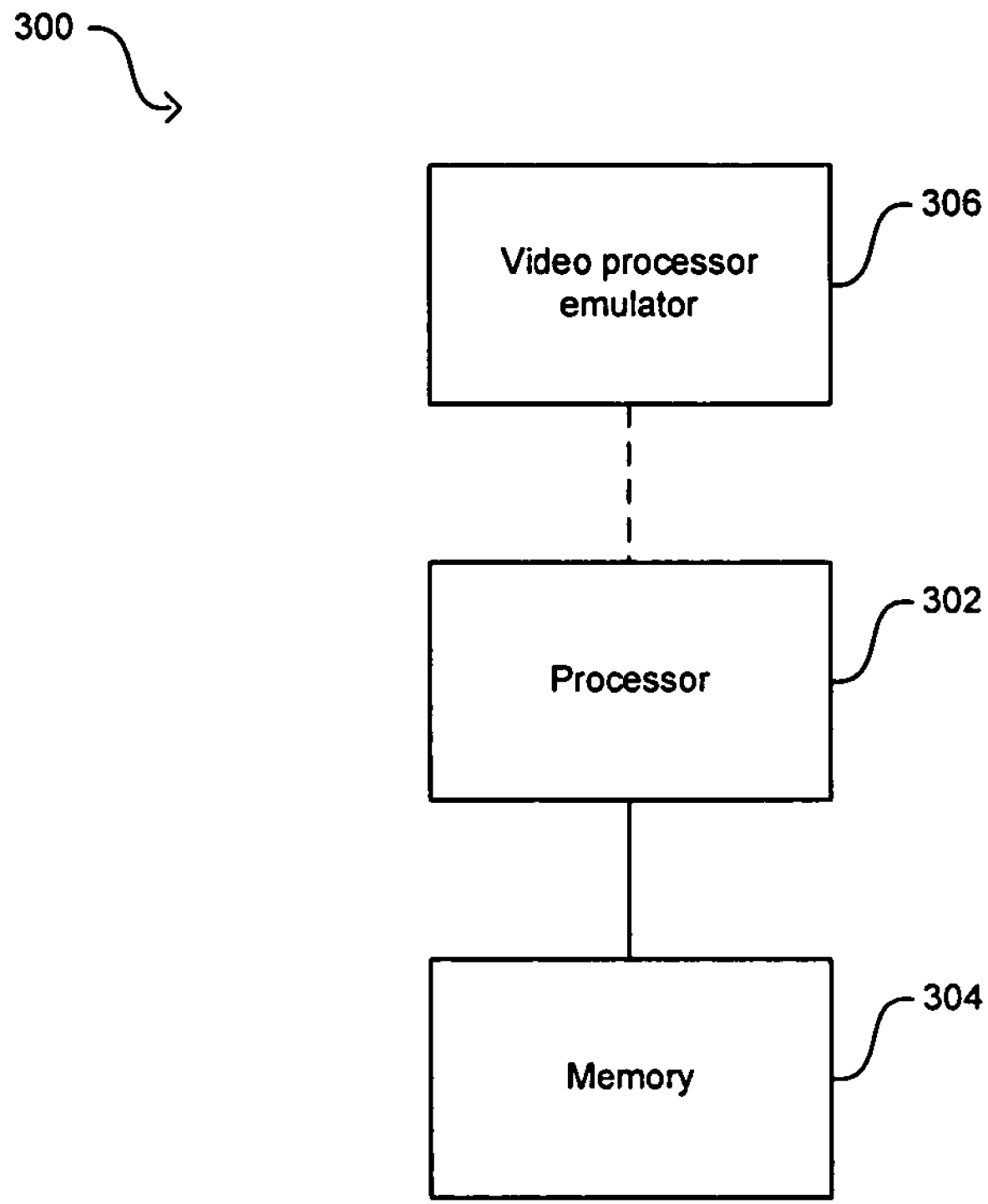
FIG. 3A is a block diagram of exemplary video processor hardware model verification system, in accordance with an embodiment of the invention.

FIG. 3A is a block diagram of exemplary video processor hardware model verification system, in accordance with an embodiment of the invention. Referring to FIG. 3A, a design verification system 300 may comprise a processor 302 and a memory 304. In this case, a description and/or representation of the video processor 100 in FIG. 1, which comprises separate video data flow and control data flow verification operations may be implemented in the processor 302 as a code and/or software representation. The code and/or software representation may be provided in, for example, a register transfer revel (RTL) description or in hardware description languages (HDLs). When the description and/or representation of the video processor 100 that comprises separate video data flow and control data flow verification operations is a hardware implementation of the design to be evaluated, for example, a field programmable gate array (FPGA) or complex programmable logic device (CPLD) implementation, then the design verification system 300 may also comprise an emulator 306 where the description and/or representation of the video processor 100 may be implemented.

Figure 3B:
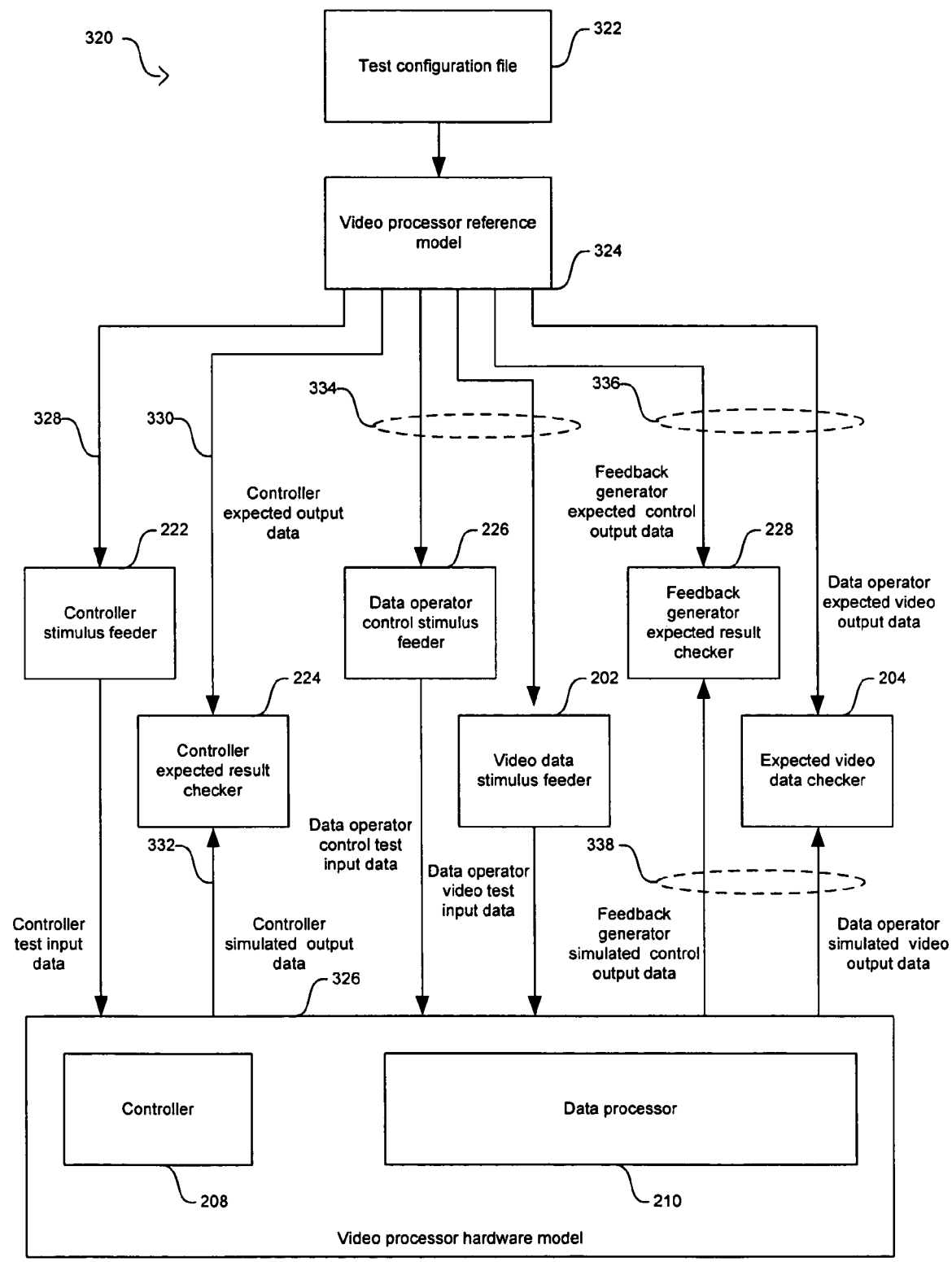
FIG. 3B is a block diagram of exemplary video processor hardware model verification system with separate video data flow and control data flow verification, in accordance with an embodiment of the invention.

FIG. 3B is a block diagram of exemplary video processor hardware model verification system with separate video data flow and control data flow verification, in accordance with an embodiment of the invention. Referring to FIG. 3B, the design verification system 320 may comprise the controller stimulus feeder 222, the controller expected result checker 224, the data operator control stimulus feeder 226, the video data stimulus feeder 202, the feedback generator expected result checker 228, the expected video data checker 204, the controller 208, and the data processor 210 in FIG. 2B. Moreover, the design verification system 320 may also comprise a test configuration file 322, a video processor reference model 324, a video processor hardware model 326, a plurality of controller test input data 328, a plurality of controller expected output data 330, a plurality of controller simulated output data 332, a plurality of data processor test input data 334, a plurality of data processor expected output data 336, and a plurality of data processor simulated output data 338.

The test configuration file 322 may comprise suitable code, for example, C code, with a plurality of parameters that describe a set of functions and/or conditions in the design and/or operation of the video processor that may require verification. The test configuration file 322 may be stored in, for example, the memory 304 in FIG. 3A. The video processor reference model 324 may comprise suitable code, for example, C code, that may be adapted to generate the plurality of controller test input data 328, the plurality of controller expected output data 330, the plurality of controller simulated output data 332, the plurality of data processor test input data 334, the plurality of data processor expected output data 336, and the plurality of data processor simulated output data 338 based on the parameters in the test configuration file 322. The video processor reference model 324 may be executed on the processor 302 in FIG. 3A, for example. In some instances, the video processor reference model 324 may be executed separately from the design verification system 320 and the results from the model may be stored in the memory 304.

The operations and/or functionality provided by the controller stimulus feeder 222, the controller expected result checker 224, the data operator control stimulus feeder 226, the video data stimulus feeder 202, the feedback generator expected result checker 228, the expected video data checker 204, the controller 208, and the data processor 210 may be implemented, for example, in the processor 302. In some instances, at least a portion of the operations and/or functionality may be implemented by utilizing more than one processor. In any case, the term processor may refer to, for example, a CPU, a DSP, an ASIC, and/or a programmable device. The video processor emulator 306 may be utilized when the description and/or representation of a video processor is to be implemented and verified in hardware. The video processor emulator 306 may be considered as a processor in some instances.

The video processor hardware model 326 may comprise suitable logic, circuitry, and/or code that may be adapted to provide a description and/or representation of the video processor 100 in FIG. 1 where the video data flow and control data flow may be separated. The video processor hardware model 326 may be executed on the processor 302. In some instances, more than one processor may be utilized to execute the video processor hardware model 326. In this regard, the video processor emulator 306 may be utilized to execute at least a portion of the video processor hardware model 326 when the video processor hardware model 326 corresponds to a description and/or representation of a video processor to be implemented and verified in hardware.

Figure 4:
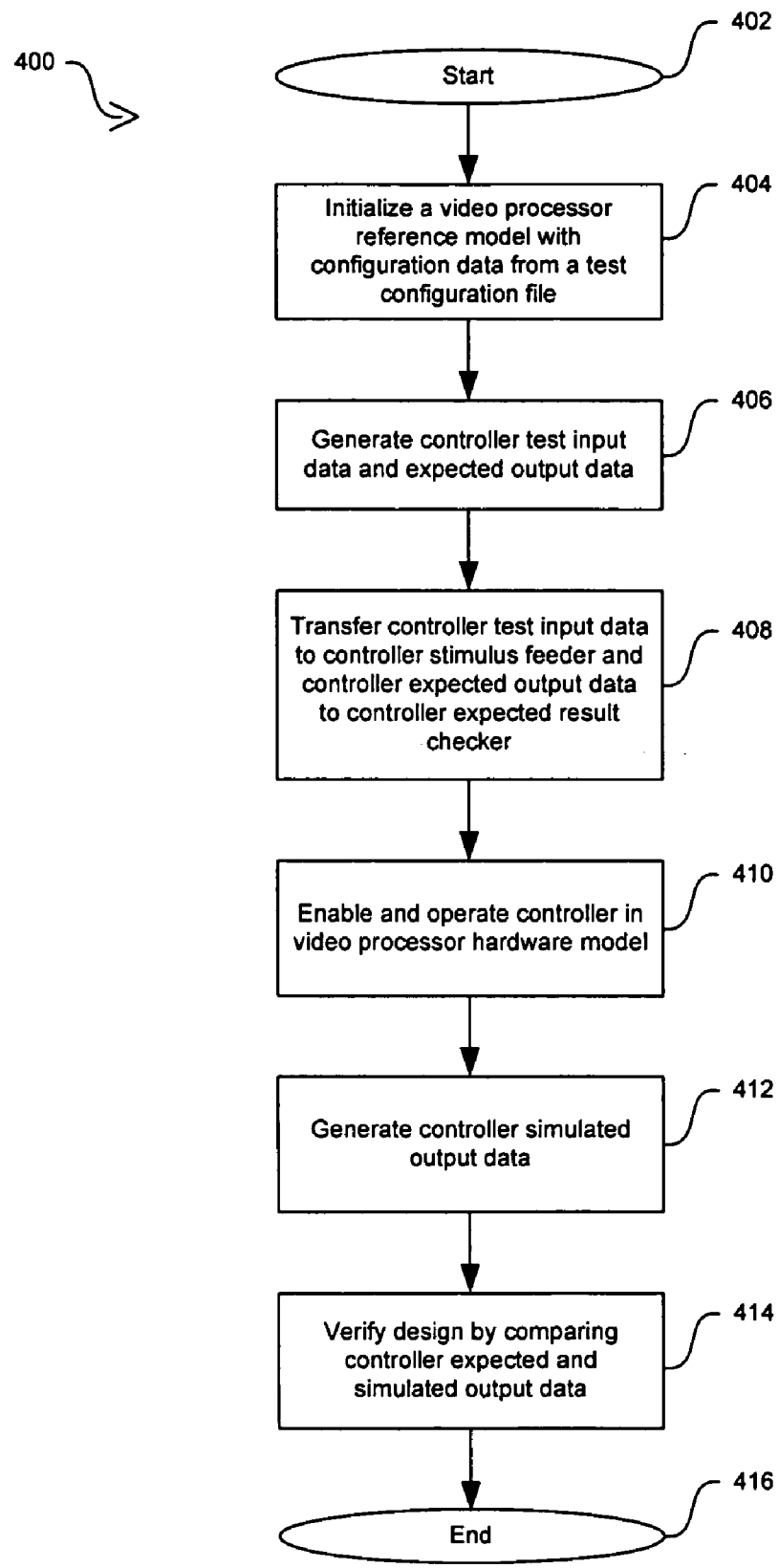
FIG. 4 is a flow diagram illustrating exemplary steps in the verification of the control data flow operations in a video processing system, in accordance with an embodiment of the invention.

FIG. 4 is a flow diagram illustrating exemplary steps in the verification of the control data flow operations in a video processing system, in accordance with an embodiment of the invention. Referring to FIG. 4, after start step 402, in step 404, the video processor reference model 324 in FIG. 3B may be initialized with the configuration data or configuration parameters provided by the test configuration file 322. The configuration data or configuration parameters in test configuration file 322 may be based on verification of the control data flow through the controller 208. In step 406, the video processor reference model 324 may generate the controller test input data 328 and the controller expected output data 330. In step 408, the video processor reference model 324 may be adapted to transfer the controller test input data 328 to the controller stimulus feeder and may transfer the controller expected output data 330 to the controller expected result checker 224. In step 410, the controller 208 in the video processor hardware model 326 may be enabled for operation. In step 412, the controller 208 may generate the controller simulated output data 332 and may transfer the results to the controller expected result checker 224. In step 414, the controller expected result checker 224 may compare the controller expected output data 330 and the controller simulated output data 332 to verify the design of the controller 208. In instances when a discrepancy may exist, an error report may be generated to identify the location of the design flaw. After completing the verification step 414, the flow diagram 400 may proceed to end step 416.

Figure 5:
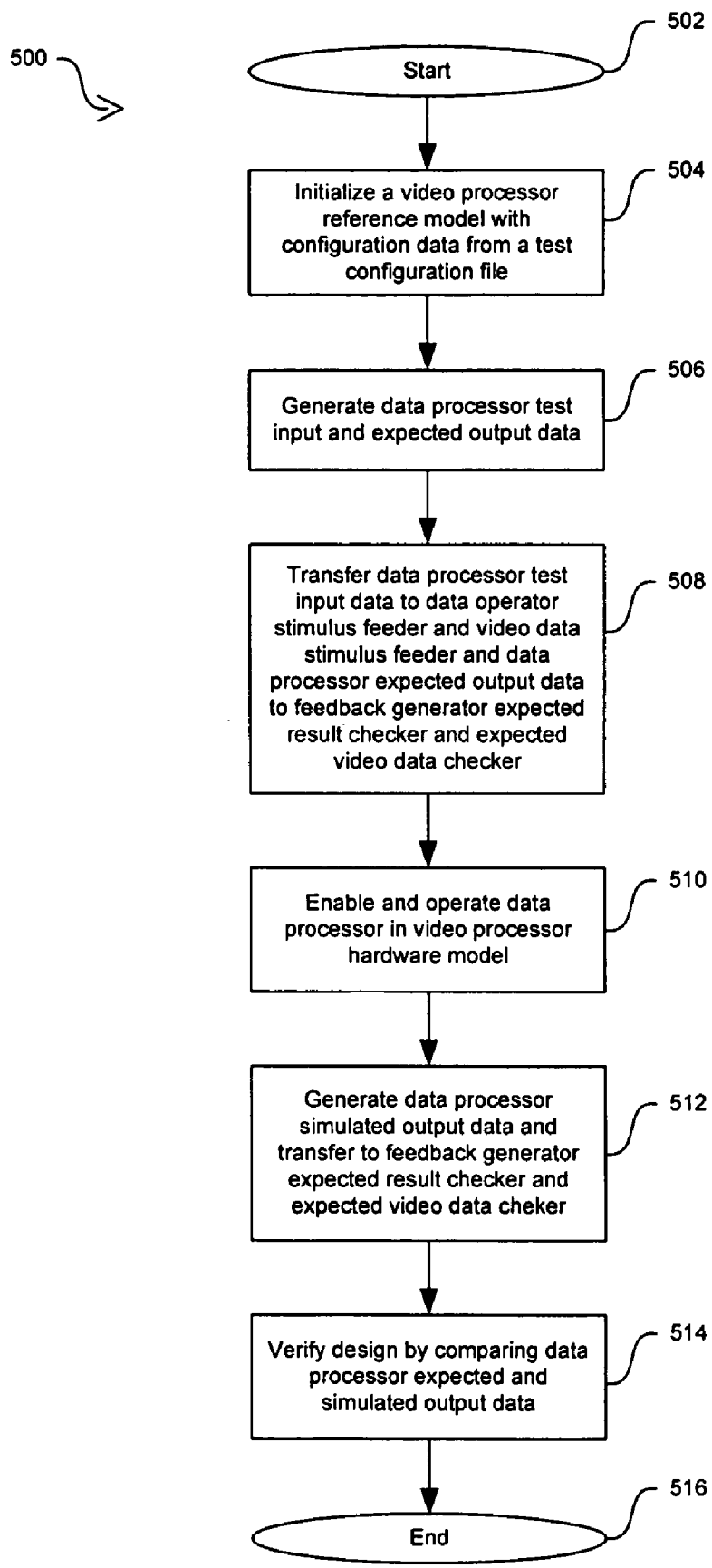
FIG. 5 is a block diagram illustrating exemplary steps in the verification of the video data flow operations in a video processing system, in accordance with an embodiment of the invention.

FIG. 5 is a block diagram illustrating exemplary steps in the verification of the video data flow operations in a video processing system, in accordance with an embodiment of the invention. Referring to FIG. 5, after start step 502, in step 504, the video processor reference model 324 in FIG. 3B may be initialized with the configuration data or configuration parameters provided by the test configuration file 322. The configuration data or configuration parameters in test configuration file 322 may be based on verification of the video data flow through the data processor 210. In step 506, the video processor reference model 324 may generate the data processor test input data 334 and the data processor expected output data 336. In this regard, the data processor test input data 334 may comprise data operator control test input data and data operator video test input data to be transferred to the data operator 212 and the content-based feedback generator 214. Moreover, the data processor expected output data 336 may comprise data operator video output data and feedback generator control output data.

In step 508, the video processor reference model 324 may transfer the data processor test input data 334 to the data operator control stimulus feeder 226 and the video data stimulus feeder 202 and may transfer the data processor expected output data 336 to the feedback generator expected result checker 228 and the expected video data checker 204. In step 510, the data processor 210 in the video processor hardware model 326 may be enabled for operation. In step 512, the data processor 210 may generate the data processor simulated output data 338 and may transfer the results to the feedback generator expected result checker 228 and the expected video data checker 204. In this regard, the data processor simulated output data 338 may comprise data operator simulated video output data and feedback generator simulated control output data.

In step 514, the feedback generator expected result checker 228 may compare the feedback generator expected control output data and the feedback generator simulated control output data and the expected video data checker 204 may compare the data operator expected video output data and the data operator simulated video output data to verify the design of the data processor 210. When a discrepancy exists, an error report may be generated to identify a location of at least one corresponding design flaw. After completing the verification step 514, the flow diagram 500 may proceed to end step 516.

The approach described herein may result in a more efficient and thorough verification of multi-field video processing systems, which may lead to faster time-to-market of a product.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for handling video processor designs, the method comprising:
   generating a test configuration file based on a video data flow function performed by a data processing portion of a multi-field video processor and based on a control data flow function performed by a control portion of said multi-field video processor;
   selecting one of said data processing portion and said control portion for verification; and
   verifying design and/or operation of said selected one of said data processing portion and said control portion by simulating said selected one of said data processing portion and said control portion utilizing test input data and comparing resulting simulated output data with expected output data, wherein:
      said test input data and said expected output data are generated based on said generated test configuration file; and
      said multi-field video processor is enabled to process video data based on results of said comparison.

2. The method according to claim 1, comprising generating control test input data by inputting said generated test configuration file to a behavioral model of said multi-field video processor.

3. The method according to claim 1, comprising selecting said multi-field video processor from a multi-field deinterlacer, a multi-field video encoder, or a multi-field video decoder.

4. The method according to claim 1, comprising generating control expected output data by inputting said generated test configuration file to a behavioral model of said multi-field video processor.

5. The method according to claim 1, comprising generating data processing test input data and a plurality of data processor expected output data by inputting said generated test configuration file to a behavioral model of said multi-field video processor.

6. A machine-readable storage having stored thereon, a computer program having at least one code for handling video processor designs, the at least one code section being executable by a computer for causing the computer to perform steps comprising:
   generating a test configuration file based on a video data flow function performed by a data processing portion of a multi-field video processor and based on a control data flow function performed by a control portion of said multi-field video processor;
   selecting one of said data processing portion and said control portion for verification; and
   verifying design and/or operation of said selected one of said data processing portion and said control portion by simulating said selected one of said data processing portion and said control portion utilizing test input data and comparing resulting simulated output data with expected output data, wherein:
      said test input data and said expected output data are generated based on said generated test configuration file; and
      said multi-field video processor is enabled to process video data based on results of said comparison.

7. The machine-readable storage according to claim 6, wherein said at least one code section comprises code for generating control test input data by inputting said generated test configuration file to a behavioral model of said multi-field video processor.

8. The machine-readable storage according to claim 6, wherein said at least one code section comprises code for selecting said multi-field video processor from a multi-field deinterlacer, a multi-field video encoder, or a multi-field video decoder.

9. The machine-readable storage according to claim 6, wherein said at least one code section comprises code for generating control expected output data by inputting said generated test configuration file to a behavioral model of said multi-field video processor.

10. The machine-readable storage according to claim 6, wherein said at least one code section comprises code for generating data processing test input data and a plurality of data processor expected output data by inputting said generated test configuration file to a behavioral model of said multi-field video processor.

11. A system for handling video processor designs, the system comprising:
   at least one processor operable to:
      generate a test configuration file based on a video data flow function performed by a data processing portion of a multi-field video processor and based on a control data flow function performed by a control portion of said multi-field video processor;
      selects one of said data processing portion and said control portion for verification; and
      verify design and/or operation of said selected one of said data processing portion and said control portion by simulating said selected one of said data processing portion and said control portion utilizing test input data and comparing resulting simulated output data with expected output data, wherein:
said test input data and said expected output data are generated based on said generated test configuration file; and
said multi-field video processor is subsequently enabled to process video data based on results of said comparison.

12. The system according to claim 11, wherein said at least one processor is operable to generates control test input data by inputting said generated test configuration file to a behavioral model of said multi-field video processor.

13. The system according to claim 11, wherein said at least one processor is operable to selects said multi-field video processor from a multi-field deinterlacer, a multi-field video encoder, or a multi-field video decoder.

14. The system according to claim 11, wherein said at least one processor is operable to generates control expected output data by inputting said generated test configuration file to a behavioral model of said multi-field video processor.

15. The system according to claim 11, wherein said at least one processor is operable to generates data processing test input data and a plurality of data processor expected output data by inputting said generated test configuration file to a behavioral model of said multi-field video processor.

16. A method for handling video processor designs, the method comprising:
separately verifying design and/or operation of a data processing portion of a video processing system and a control portion of a video processing system, wherein:
said data processing portion is verified by simulating said data processing portion with data processing input test data and comparing output data from said simulation to data processing expected output data;
said control portion is verified by simulating said control portion with control input test data and comparing resulting output data from said simulation to control portion expected output data; and
said data processing input test data, said data processing expected output data, said control input test data, and said control expected output data are generated via a behavioral model of said video processing system; and
said video processing system is subsequently enabled to process video data based on results of said verification.

17. The method according to claim 16 comprising, inputting a test configuration file to said behavioral model of said video processing system to generate said data processing input test data, said data processing expected output data, said control input test data, and said control expected output data.

18. The method according to claim 17, comprising generating said test configuration file based on a video data flow function performed by said data processing portion of said video processing system and based on a control data flow function performed by said control portion of said video processing system.

19. A machine-readable storage having stored thereon, a computer program having at least one code for handling video processor designs, the at least one code section being executable by a computer for causing the computer to perform steps comprising:
separately verifying design and/or operation of a data processing portion of a video processing system and a control portion of a video processing system, wherein:
said data processing portion is verified by simulating said data processing portion with data processing input test data and comparing output data from said simulation to data processing expected output data;
said control portion is verified by simulating said control portion with control input test data and comparing resulting output data from said simulation to control portion expected output data; and
said data processing input test data, said data processing expected output data, said control input test data, and said control expected output data are generated via a behavioral model of said video processing systems; and
said video processing system is subsequently enabled to process video data based on results of said verification.

20. The machine-readable storage according to claim 19, wherein said at least one code section comprises code for inputting a test configuration file to said behavioral model of said video processing system to generate said data processing input test data, said data processing expected output data, said control input test data, and said control expected output data.

21. The machine-readable storage according to claim 20, wherein said at least one code section comprises code for generating said test configuration file based on a video data flow function performed by said data processing portion of said video processing system and based on a control data flow function performed by said control portion of said video processing system.

22. A system for handling video processor designs, the system comprising:
at least one processor operable to:
separately verify design and/or operation of a data processing portion of a video processing system and a control portion of a video processing system, wherein:
said data processing portion is verified by simulating said data processing portion with data processing input test data and comparing output data from said simulation to data processing expected output data;
said control portion is verified by simulating said control portion with control input test data and comparing resulting output data from said simulation to control portion expected output data; and
said data processing input test data, said data processing expected output data, said control input test data, and said control expected output data are generated via a behavioral model of said video processing system; and
said video processing system is subsequently enabled to process video data based on results of said verification.

23. The system according to claim 22, wherein said at least one processor is operable to input a test configuration file to said behavioral model of said video processing system to generate said data processing input test data, said data processing expected output data, said control input test data, and said control expected output data.

24. The system according to claim 23, wherein said at least one processor is operable to generate said test configuration file based on a video data flow function performed by said data processing portion of said video processing system and based on a control data flow function performed by said control portion of said video processing system.

25. A method for handling video processor designs, the method comprising:
separately verifying design and/or operation of a data processing portion of a video processing system and a control portion of said video processing system by:

generating, via a behavioral model of said video processing system, control input test data, control expected output data, data processing input test data, and data processing expected output data; and inputting said control input test data to a simulation of said video processing system and comparing a resulting output of said simulation to said control expected output data; and inputting said data processing input test data to a simulation of said video processing system and comparing a resulting output of said simulation to said data processing expected output data;

wherein said video processing system is subsequently enabled to process video data based on results of said verification.

26. The method according to claim 25, comprising inputting a test configuration file to said behavioral model of said video processing system to generate said data processing input test data, said data processing expected output data, said control input test data, and said control expected output data.

27. The method according to claim 26, comprising generating said test configuration file based on a video data flow function performed by said data processing portion of said video processing system and based on a control data flow function performed by said control portion of said video processing system.

28. A machine-readable storage having stored thereon, a computer program having at least one code for handling video processor designs, the at least one code section being executable by a computer for causing the computer to perform steps comprising:

separately verifying design and/or operation of a data processing portion of a video processing system and a control portion of said video processing system by:

generating, via a behavioral model of said video processing system, control input test data, control expected output data, data processing input test data, and data processing expected output data; and inputting said control input test data to a simulation of said video processing system and comparing a resulting output of said simulation to said control expected output data; and inputting said data processing input test data to a simulation of said video processing system and comparing a resulting output of said simulation to said data processing expected output data;

wherein said video processing system is subsequently enabled to process video data based on results of said verification.

29. The machine-readable storage according to claim 28, wherein said at least one code section comprises code for inputting a test configuration file to said behavioral model of said video processing system to generate said data processing input test data, said data processing expected output data, said control input test data, and said control expected output data.

30. The machine-readable storage according to claim 29, wherein said at least one code section comprises code for generating said test configuration file based on a video data flow function performed by said data processing portion of said video processing system and based on a control data flow function performed by said control portion of said video processing system.

31. A system for handling video processor designs, the system comprising:

at least one processor operable to:

separately verify design and/or operation of a data processing portion of a video processing system and a control portion of said video processing system by:

generating, via a behavioral model of said video processing system, control input test data, control expected output data, data processing input test data, and data processing expected output data; and inputting said control input test data to a simulation of said video processing system and comparing a resulting output of said simulation to said control expected output data; and inputting said data processing input test data to a simulation of said video processing system and comparing a resulting output of said simulation to said data processing expected output data;

wherein said video processing system is subsequently enabled to process video data based on results of said verification.

32. The system according to claim 31, wherein said at least one processor is operable to input a test configuration file to said behavioral model of said video processing system to generate said data processing input test data, said data processing expected output data, said control input test data, and said control expected output data.

33. The system according to claim 32, wherein said at least one processor is operable to generate said test configuration file based on a video data flow function performed by said data processing portion of said video processing system and based on a control data flow function performed by said control portion of said video processing system.

* * * * *